United States Patent
Miyajima

(12) 
(10) Patent No.: US 6,168,364 B1
(45) Date of Patent: Jan. 2, 2001

(54) VACUUM CLEAN BOX, CLEAN TRANSFER METHOD AND APPARATUS THEREFOR

(75) Inventor: Toshihiko Miyajima, Tokyo (JP)

(73) Assignee: TDK Corporation, Tokyo (JP)

( * ) Notice: Under 35 U.S.C. 154(b), the term of this patent shall be extended for 0 days.

(21) Appl. No.: 09/294,005

(22) Filed: Apr. 19, 1999

(51) Int. Cl.$^7$ ............................................... B65G 49/07
(52) U.S. Cl. ........................................ 414/217; 414/940
(58) Field of Search .................................. 414/939, 940, 414/217, 217.1

(56) References Cited

U.S. PATENT DOCUMENTS

| | | | |
|---|---|---|---|
| 4,636,128 | * 1/1987 | Millis et al. ........................... | 414/217 |
| 5,139,459 | 8/1992 | Takahashi et al. . | |
| 5,364,219 | 11/1994 | Takahashi et al. . | |
| 5,472,086 | * 12/1995 | Holliday et al. ................... | 414/217 X |
| 5,562,383 | * 10/1996 | Iwai et al. ......................... | 414/940 X |
| 5,609,459 | * 3/1997 | Muka ................................ | 414/217.1 |
| 5,730,573 | 3/1998 | Masujima et al. . | |

FOREIGN PATENT DOCUMENTS

| | | | |
|---|---|---|---|
| 63-28047 | 2/1988 | (JP) . | |
| 63-190338 | * 8/1988 | (JP) ....................................... | 414/940 |
| 2525284 | 5/1996 | (JP) . | |
| 9-246351 | 9/1997 | (JP) . | |
| 2722306 | 11/1997 | (JP) . | |
| 10-56050 | 2/1998 | (JP) . | |
| 2757102 | 3/1998 | (JP) . | |
| 10-321695 | 12/1998 | (JP) . | |
| 10-32196 | 12/1998 | (JP) . | |

* cited by examiner

*Primary Examiner*—Steven A. Bratlie
(74) *Attorney, Agent, or Firm*—Oblon, Spivak, McClelland, Maier & Neustadt, P.C.

(57) ABSTRACT

A vacuum clean box 30 includes a box body 31 having a side aperture 32 and a small hole 33 for intake/exhaust, a side lid 34 for closing the side aperture 32 by a pressure difference between inside and outside thereof, and an additional lid 35 for similarly closing the small hole 33 for intake/exhaust. The vacuum clean box 30 is connected to a gate aperture 42 of a clean room 40 and a vacuum changer 50 evacuates a hermetically closed space outside the box body including the additional lid 35 to cancel the pressure difference between inside and outside of the additional lid 35 and then opens the small hole 33 for intake/exhaust. After the inside of the vacuum clean box 30 is turned into the atmospheric pressure through the small hole 33 for intake/exhaust, the side lid 34 is drawn into the clean room 40 to make communication between the inside space of the vacuum clean box and the inside of the clean room 40, and then objects to be transferred are transferred between the vacuum clean box and the clean room.

5 Claims, 6 Drawing Sheets

VACUUM CLEAN BOX, CLEAN TRANSFER METHOD AND APPARATUS THEREFOR

BACKGROUND OF THE INVENTION

1. Field of the Invention

The present invention relates to a vacuum clean box constructed such that objects to be transferred, necessary for fabrication processes of semiconductors, electron-device-associated products, optical disks, etc., can be transferred in a clean state with no contaminants and, particularly, the objects to be transferred are carried through a side aperture into or out of the box. Also, the present invention relates to a clean transfer method and apparatus using this vacuum clean box.

2. Related Background Art

Transfer boxes using the mechanical seal as illustrated in FIG. 6 have been used heretofore for transferring semiconductor wafers or the like.

The assignee of the present invention suggested a clean transfer method for transferring the objects to be transferred, in a vacuum clean box in a vacuum sealed state in Japanese Laid-open Patent Application No. 7-235580. FIG. 5 shows an example of the vacuum clean box used in this case.

The vacuum clean box 1 illustrated in FIG. 5 is composed of a box body 2 and a bottom lid 3 also serving as a shutter for hermetic sealing, and a closed state thereof is maintained such that the bottom lid 3 is urged against the box body by a pressure difference between inside and outside the box (the inside of the box being a vacuum and the outside the atmospheric pressure). A holder 5 holds objects 4 to be transferred, for example, in a multiply stacked state on the bottom lid 3. This vacuum clean box 1 is structured to open and close the bottom surface.

For opening the bottom lid 3 of the vacuum clean box 1, the vacuum clean box 1 is mounted on a connection block 12 with an open/close aperture 11 of a vacuum changer 10, which is indicated by fictitious lines in FIG. 5, the open/close aperture 11 is closed by an up-and-down type shutter 13, and a hermetically closed space surrounded by the connection block 12, the bottom lid 3, and the up-and-down type shutter 13 is evacuated to cancel the pressure difference between inside and outside the bottom lid 3. After that, the objects 4 on the bottom lid, together with the bottom lid 3, are vertically lowered, as indicated by an arrow A, by a lid receiving up-and-down stage 14 on the vacuum changer 10 side to be drawn into the vacuum changer 10 and thereafter the objects 4 are horizontally transferred as indicated by an arrow B.

Incidentally, in the case of the vacuum clean box 1 of the bottom opening/closing type of FIG. 5, the vertical motion as indicated by the arrow A is essential to the operation of carrying the objects 4 into or out of the box. This involves change in the height of the objects 4 from the floor surface, so that the excess vertical motion is required, in addition to the horizontal motion for interface with various processing devices. In addition, since the vertical motion is necessary for carrying the objects 4 into or out of the box, there arises a problem that the placement height of the vacuum clean box 1 on the vacuum changer 10 also becomes high.

Meanwhile, standardization of the transfer boxes for semiconductors is under way in EIAJ (J300). The transfer boxes heretofore were of the type of taking the semiconductor wafers out of the bottom side of the box, but a laterally drawing method is being determined as a standardized method for the reason that the placement height of the box is high in the bottom opening/closing type. For example, the transfer box 20 for semiconductors of FIG. 6 is also of the side open type having an aperture 21 in a side surface. This box, however, still leaves us the following challenges because of the mechanical seal; (1) a complex mechanism is necessary and sufficient reliability cannot be assured; (2) holding power sufficient for practical use cannot be obtained because of utilization of the mechanical holding power of springs or the like.

SUMMARY OF THE INVENTION

A first object of the present invention is, in view of the above points, to provide a vacuum clean box that does not have to use the conventional mechanical seal with the springs or the like even in the structure of the side open type, by employing a configuration in which a side lid can hermetically close a side aperture by a pressure difference between inside and outside thereof, and that has simple structure.

A second object of the present invention is to provide a clean transfer method and apparatus capable of transferring the objects to be transferred in the vacuum sealed state, using the vacuum clean box of the side open type in the simple structure without use of the mechanical seal.

The other objects and novel features of the present invention will become apparent in the description of embodiments hereinafter.

For accomplishing the above objects, a clean box of the present invention comprises a box body having an aperture in one side surface and a small hole for intake/exhaust in another surface; a side lid for hermetically closing said aperture by a pressure difference between inside and outside thereof; and an additional lid for hermetically closing said small hole for intake/exhaust by a pressure difference between inside and outside thereof.

A clean transfer method of the present invention is a clean transfer method using a vacuum clean box comprising a box body having an aperture in one side surface and a small hole for intake/exhaust in another surface; a side lid for hermetically closing said aperture by a pressure difference between inside and outside thereof; and an additional lid for hermetically closing said small hole for intake/exhaust by a pressure difference between inside and outside thereof, said clean transfer method comprising hermetically connecting said vacuum clean box to a gate aperture of a clean device, said gate aperture being formed in a side wall surface of said clean device and being hermetically closed by a gate valve; evacuating a hermetically closed space outside the box body, including said additional lid, by a vacuum changer to cancel the pressure difference between inside and outside of said additional lid and opening said small hole for intake/exhaust to turn the inside of said vacuum clean box into the atmospheric pressure through said small hole for intake/exhaust; thereafter drawing the side lid into said clean device while holding said side lid by said gate valve to establish communication between an inside space of said vacuum clean box and the inside of said clean device; and transferring objects to be transferred between said clean box and said clean device.

Further, a clean transfer apparatus of the present invention is a clean transfer apparatus comprising:

a vacuum clean box comprising a box body having an aperture in one side surface and a small hole for intake/exhaust in another surface; a side lid for hermetically closing said aperture by a pressure difference between inside and outside thereof; and an additional lid for hermetically closing said small hole for intake/exhaust by a pressure difference between inside and outside thereof;

a clean device having a gate aperture formed in a side wall surface thereof and a gate valve capable of opening or closing said gate aperture and capable of holding the side lid of the vacuum clean box connected to the gate aperture; and a vacuum changer for evacuating a hermetically closed space outside the box body, including the additional lid of the vacuum clean box connected to said gate aperture, wherein in a state in which said vacuum changer cancels the pressure difference between inside and outside of said additional lid and opens said small hole for intake/exhaust to turn the inside of said vacuum clean box into the atmospheric pressure through said small hole for intake/exhaust, said side lid is drawn into said clean device while being held by said gate valve, to establish communication between an inside space of said vacuum clean box and the inside of said vacuum clean device.

The clean transfer apparatus may also be so constructed that said vacuum changer has a box holding member constructed such that a vacuum suction passage for suction of said box body is formed in an opposite surface thereof to said box body and that said hermetically closed space is formed inside said box holding member.

Further, the clean transfer apparatus may also be so constructed that said vacuum changer has a lid receiver for receiving said additional lid separated from said box body, inside said box holding member, said lid receiver being movable.

The vacuum clean box according to the present invention has neither evacuation means, e.g., a vacuum pump for evacuating the inside of the box and other valves, pipes, etc. forming an evacuation system, nor transfer means for transferring the box itself.

DETAILED DESCRIPTION OF THE PREFERRED EMBODIMENTS

Figure 1:
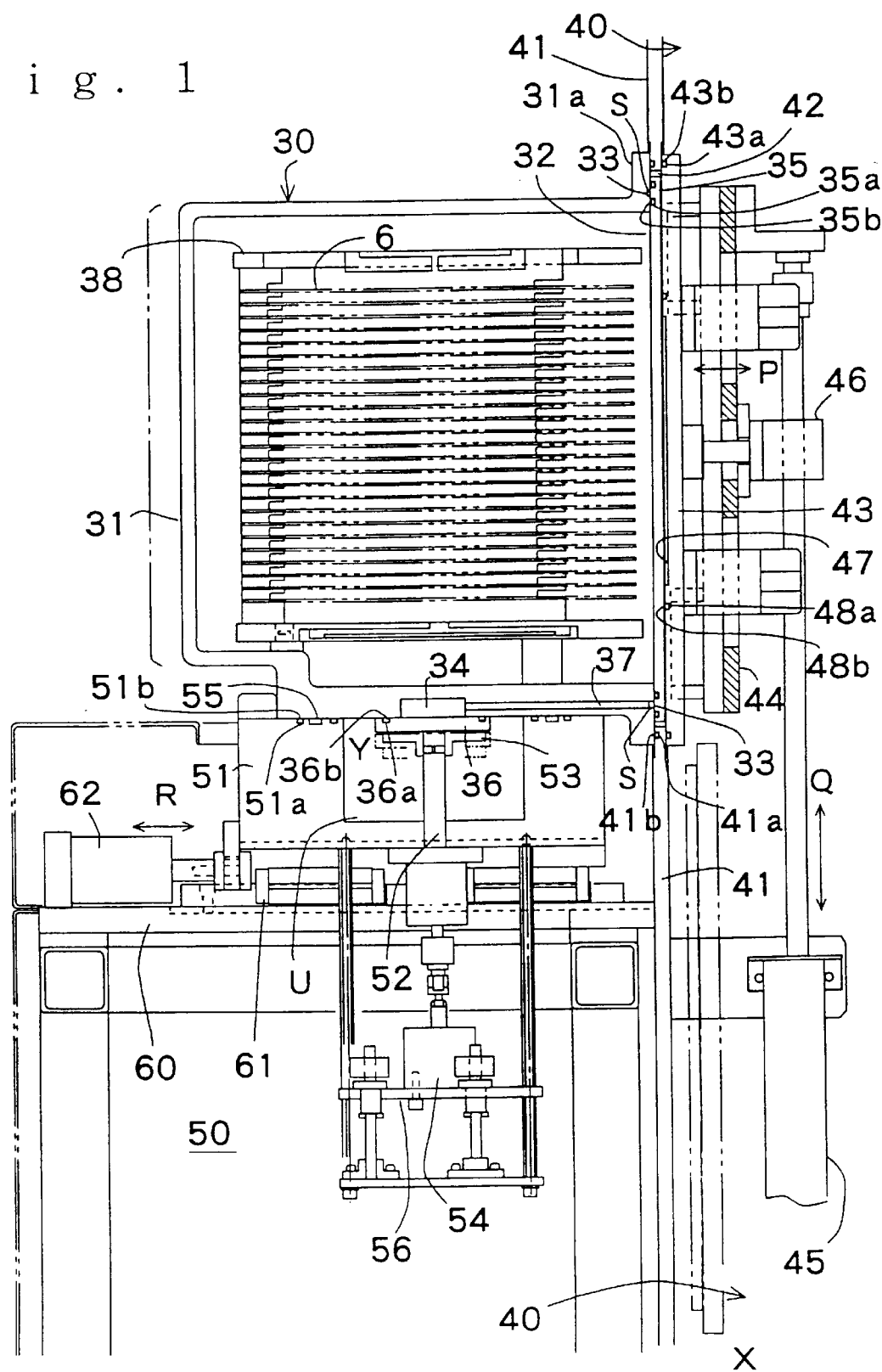
FIG. 1 is a front sectional view to show an embodiment of the present invention in a connection preparation stage for connection between the vacuum clean box and the clean room, in which the vacuum clean box is mounted on the vacuum changer.

Embodiments of the vacuum clean box and the clean transfer method and apparatus according to the present invention will be described below referring to the drawings.

In FIG. 1 to FIG. 4, the vacuum clean box 30 is comprised of a box body 31 having a side aperture 32 in one side surface and a small hole 33 for intake/exhaust in a bottom surface, a side lid 34 for hermetically closing the aperture 32 by the pressure difference between inside and outside thereof, and an additional lid 35 for hermetically closing the intake/exhaust small hole 33 by the pressure difference between inside and outside thereof, it secures airtightness enough to maintain a vacuum state during closing of the side lid 34 and the additional lid 35, and it has neither evacuation means nor transfer means. For assuring airtightness, an annular groove 34a is formed in an opposite surface of the side lid 34 in contact with a side flange portion 31a of the box body 31, and an O-ring 34b for hermetic sealing is fitted in the annular grooves 34a. For assuring airtightness, an annular groove 35a is also formed in an opposite surface of the additional lid 35 in contact with the peripheral part of the intake/exhaust small hole 33 and an O-ring 35b for hermetic sealing is disposed in the annular groove 35a.

A holder 36 for supporting the objects 4 to be transferred, such as the semiconductor wafers or the like, is attached in the box body 31. The holder 36 is constructed, for example, such that many objects 4 to be transferred can be stored at equal intervals in a horizontal state.

A clean room 40 has a gate aperture (exit/entrance) 42 in its side wall 41 in order to allow the objects 4 such as the semiconductor wafers or the like to be carried thereinto by use of the vacuum clean box 30 or allow the objects 4 to be carried out therefrom into the vacuum clean box 30. This gate aperture 42 is of a structure capable of being opened or closed by a gate valve 43. Namely, the gate valve 43 is attached to a vertical plate-like up-and-down member 44 provided behind it so as to be movable in parallel horizontally (in directions along an arrow P), and the up-and-down member 44 is driven up and down in directions along an arrow Q by a pneumatic cylinder 45. The gate valve 43 is laterally driven by a pneumatic cylinder 46 attached to the up-and-down member 44 (i.e., it is driven so as to close or open the gate aperture 42). For assuring airtightness, an annular groove 43a is formed in an opposite surface of the gate valve 43 in contact with the peripheral part of the gate aperture 42, and an O-ring 43b for hermetic sealing is provided in the annular groove 43a.

As illustrated in FIG. 1, when the cylinder 46 is stretched at the up position of the up-and-down member 44 where the cylinder 45 is stretched, the gate valve 43 is pressed against the inside peripheral part of the side wall 41 having the gate aperture 42, thereby hermetically closing the gate aperture 42. After the cylinder 46 is retracted at the up position of the up-and-down member 44 to separate the gate valve 43 from the gate aperture 42 and when the cylinder 45 is retracted to move the up-and-down member 44 down, the gate valve 43 is moved down to the position X of FIG. 2, whereby the gate aperture 42 can be opened.

A suction recess 47 for vacuum suction of the side lid 34 on the vacuum clean box 30 side is formed in the gate valve 43, an annular groove 48a is formed around the suction recess 47, and an O-ring 48b for hermetic sealing is provided in the annular groove 48a.

There is a vacuum changer 50 (with evacuation means) provided for evacuating the inside of the vacuum clean box 30 or for returning the inside to the atmospheric pressure (normally, the vacuum changer 50 being disposed at a position outside the clean room 40 and below the gate aperture 42), and this vacuum changer 50 has a cup-shape mount stage 51 as a box holding member for holding the vacuum clean box 30 at a height where the vacuum clean box 30 can be connected to the gate aperture 42 of the clean room 40, the mount stage 51 being slidable in horizontal directions (in directions along an arrow R). Namely, the cup-shape mount stage 51 is attached via a lateral slider 61 to a fixed base 60 of the vacuum changer 50, so that the mount stage 51 can be moved toward or away from the side wall 41 of the clean room 40 with a stretching or retracting operation of a pneumatic cylinder 62 mounted on the fixed base 60 for lateral movement of the mount stage.

A lid receiver 53 for supporting the additional lid 35 separated from the box body 31 is fixed to an upper end of an up-and-down shaft 52 vertically penetrating the inside central part of the cup-shape mount stage 51. A pneumatic cylinder 54 for driving the up-and-down shaft 52 fixed to the lid receiver 53 up and down is fixed to a fitting plate 56 supported on the side of the cup-shape mount stage 51, and a piston rod of the pneumatic cylinder 54 is connected to the up-and-down shaft 52.

An annular groove 55 for vacuum suction of the bottom surface of the vacuum clean box 30 is formed in a vacuum clean box mount surface of the cup-shape mount stage 51, an annular groove 51a for assuring airtightness is formed in each of the inside and outside of this annular groove 55 for suction, and an O-ring 51b for hermetic sealing is fitted in each of the annular grooves 51a.

For assuring airtightness, an annular groove 41a surrounding the gate aperture 42 is formed in the outside, opposite surface of the side wall 41 in contact with the side flange portion 31a of the vacuum clean box 30 (the peripheral part of the side aperture 32), and an O-ring 41b for hermetic sealing is fitted in the annular groove 41a.

The operation of this embodiment will be described next.

Figure 4:
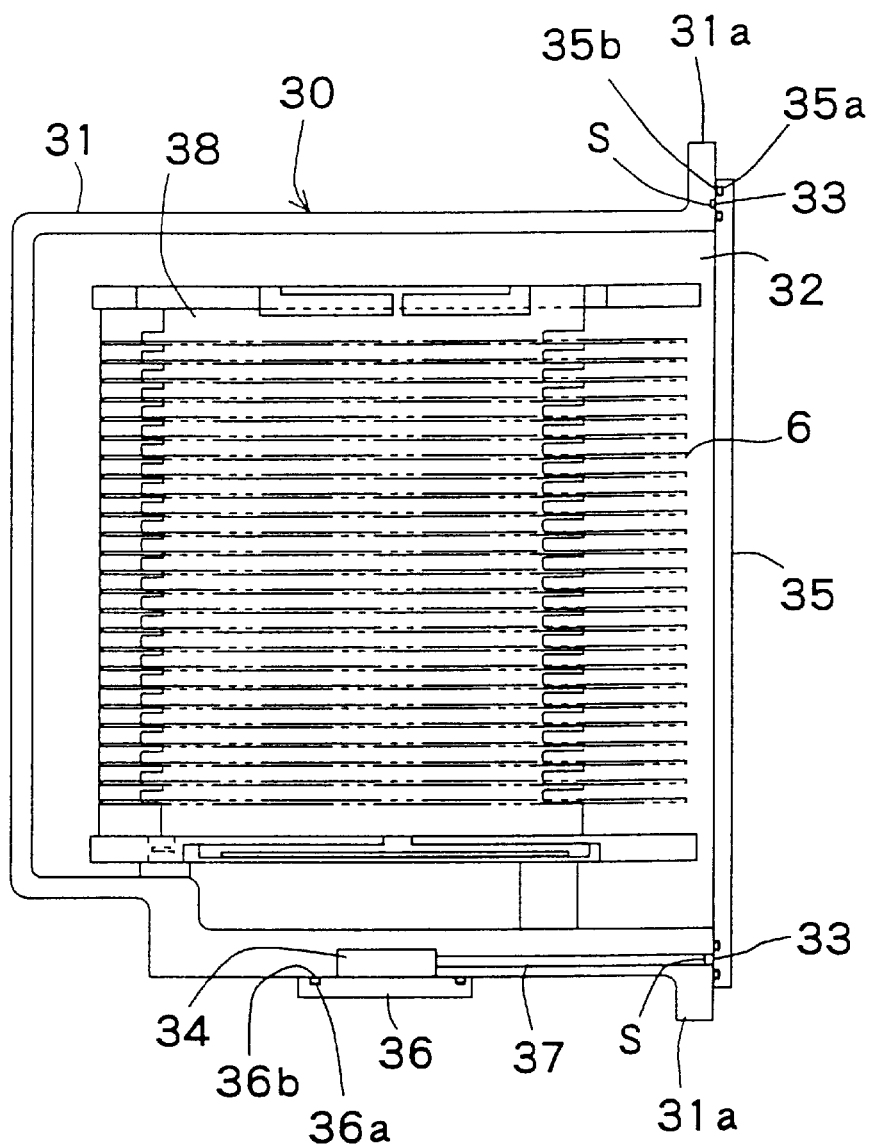
FIG. 4 is a front sectional view to show the vacuum clean box in a separated state.
Figure 5:
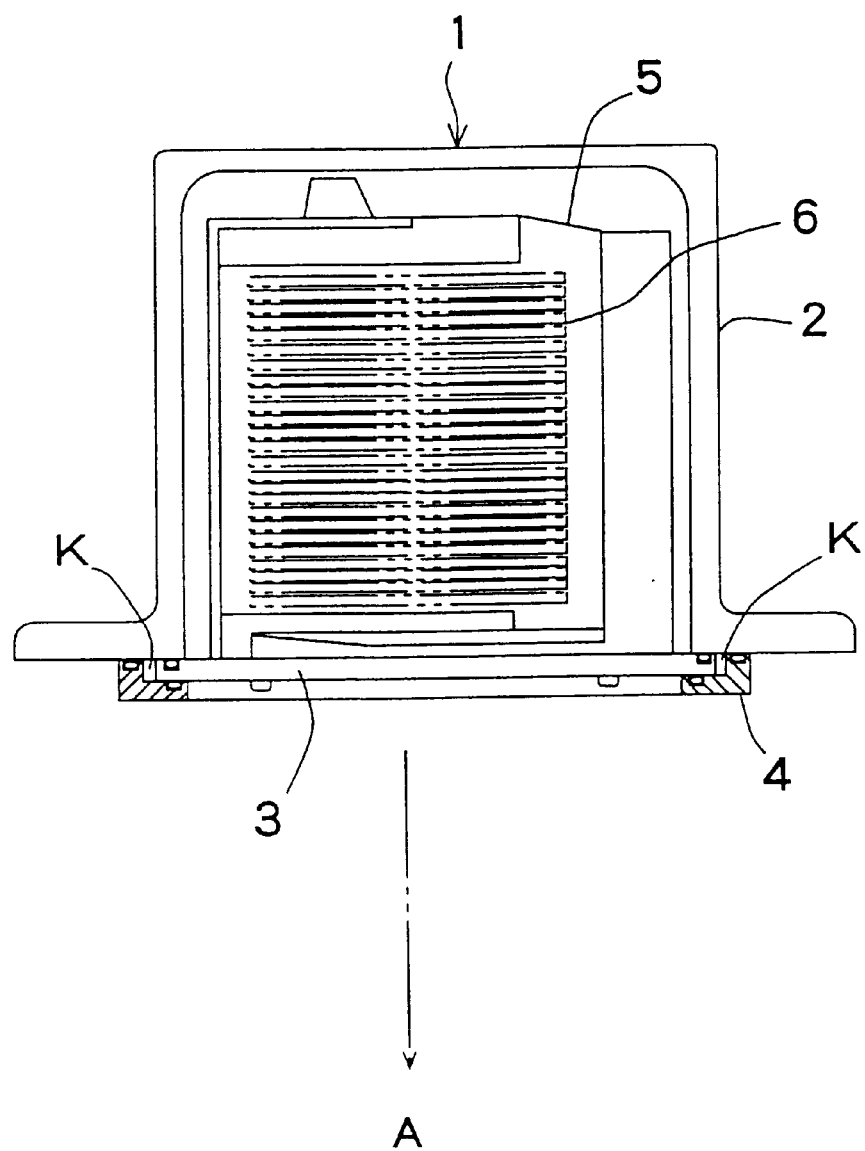
FIG. 5 is a front sectional view to show the conventional vacuum clean box.
Figure 6:
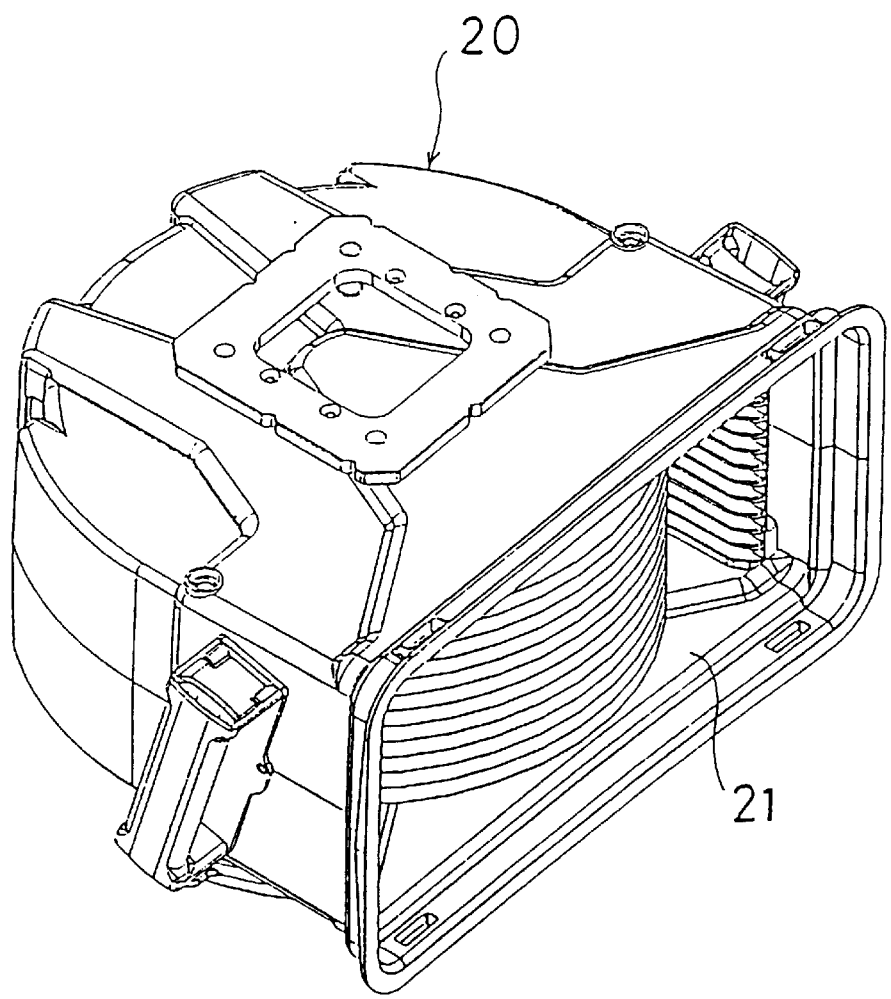
FIG. 6 is a front sectional view to show the conventional transfer box for semiconductors of the side open type using the mechanical seal.
Figure 1:
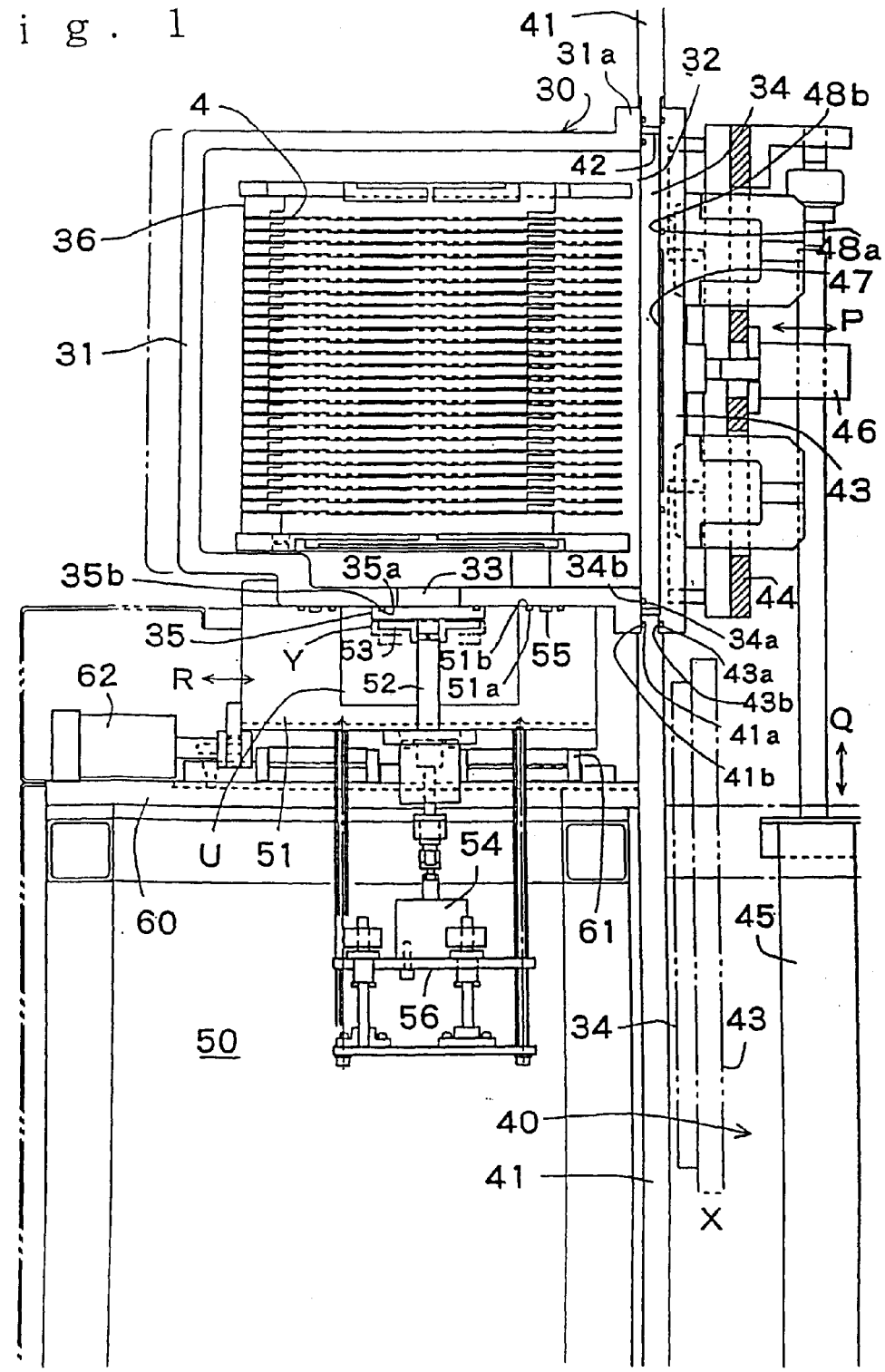
Figure 2:
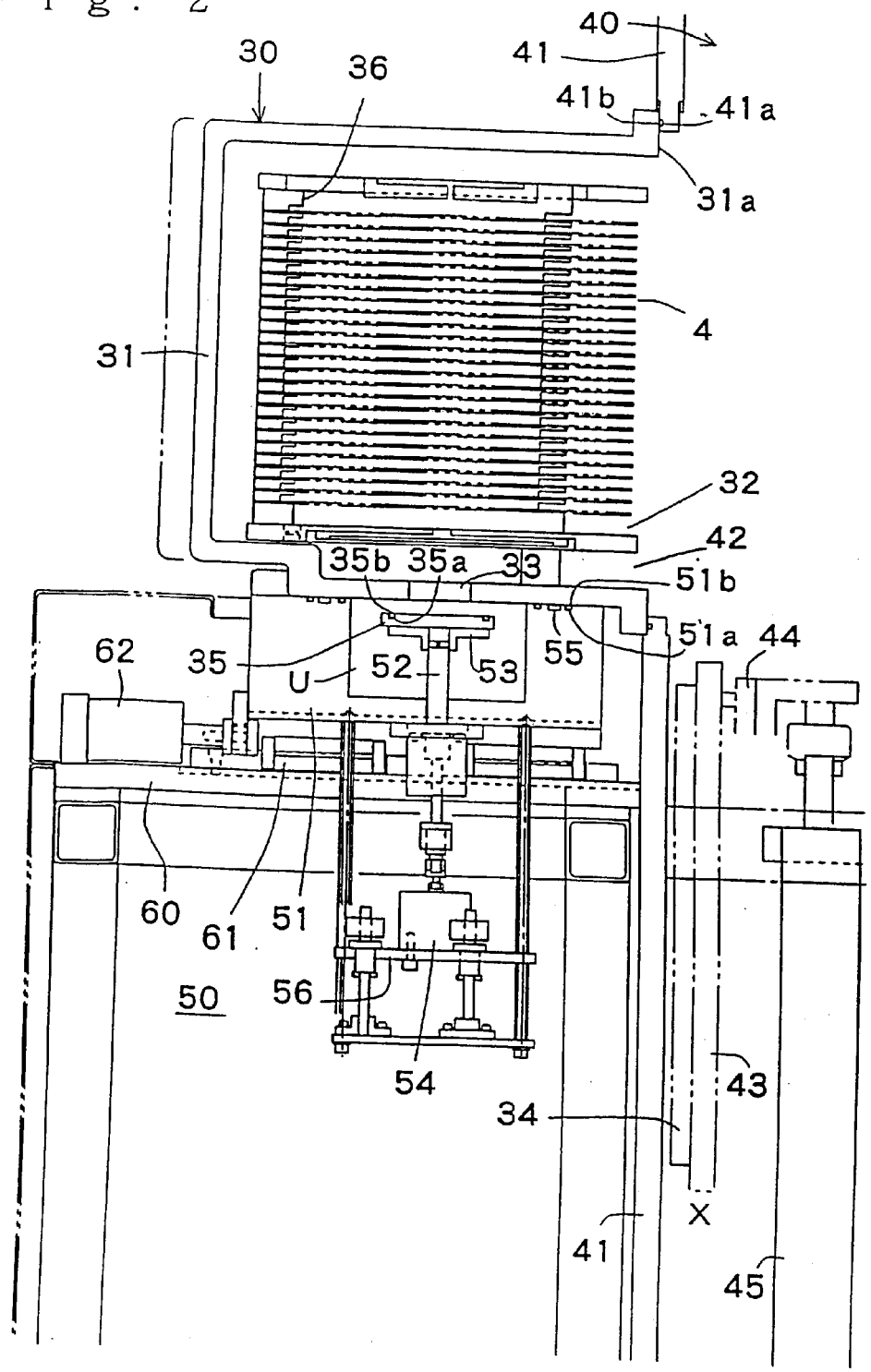
Figure 3:
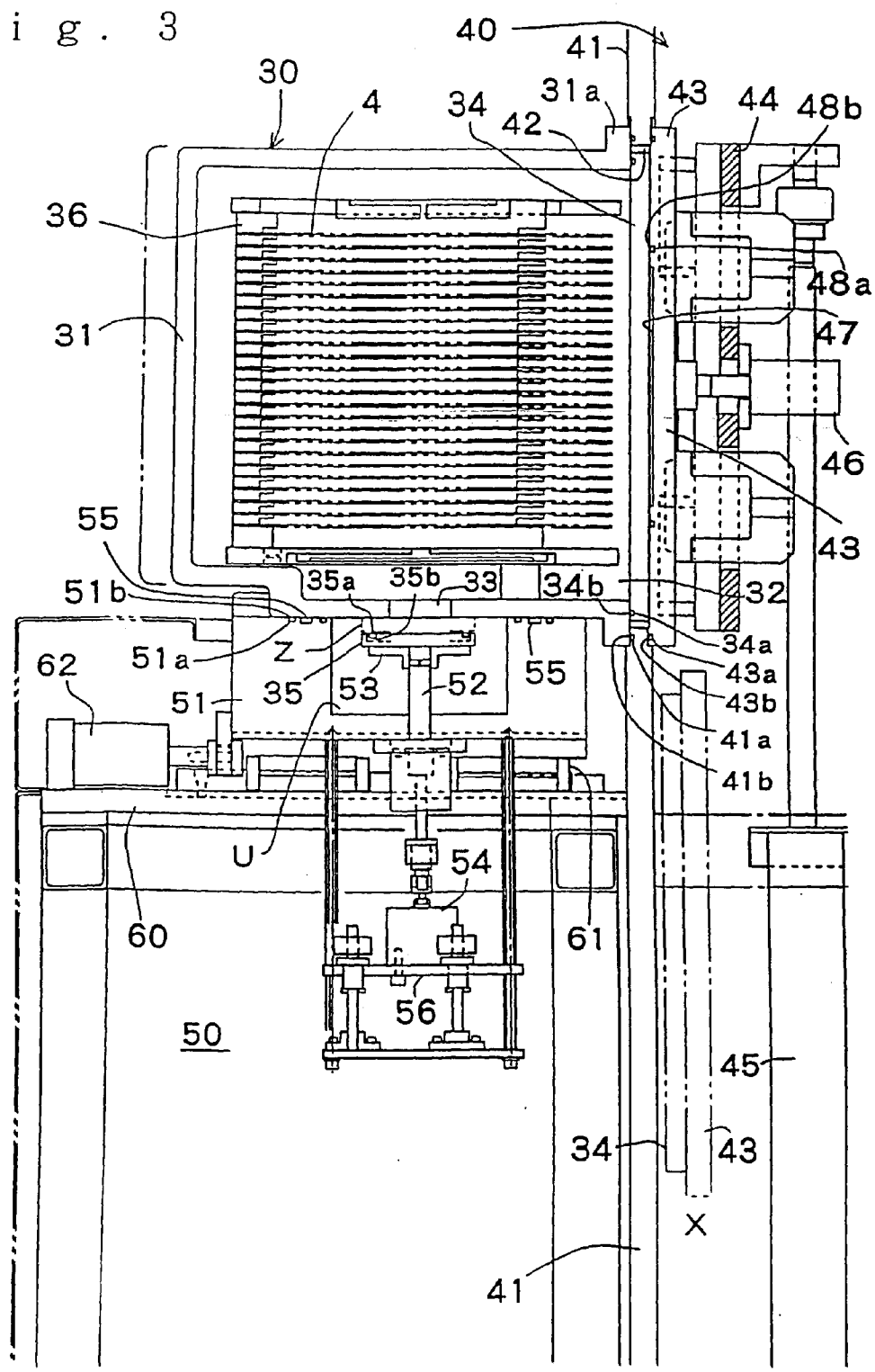
Figure 4:
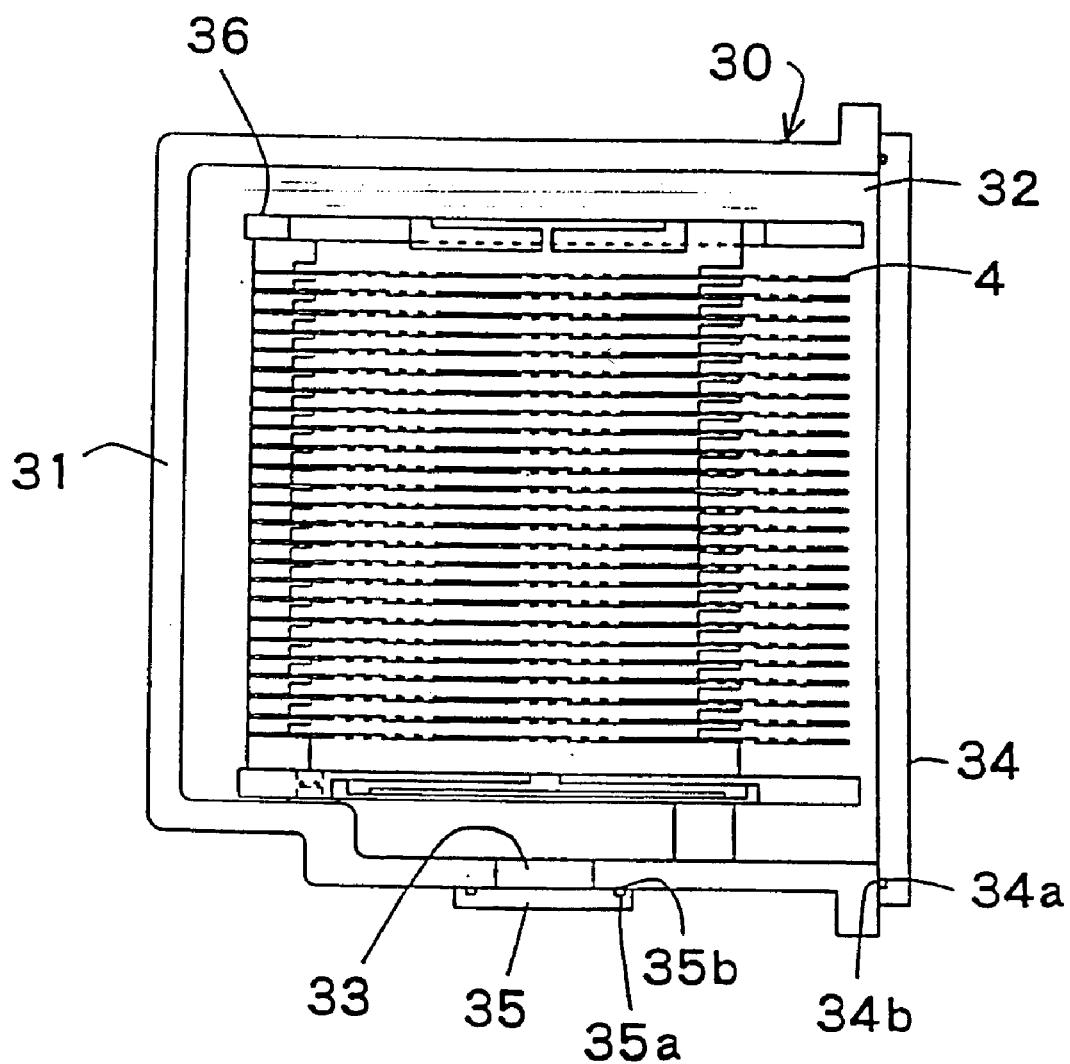
Figure 5:
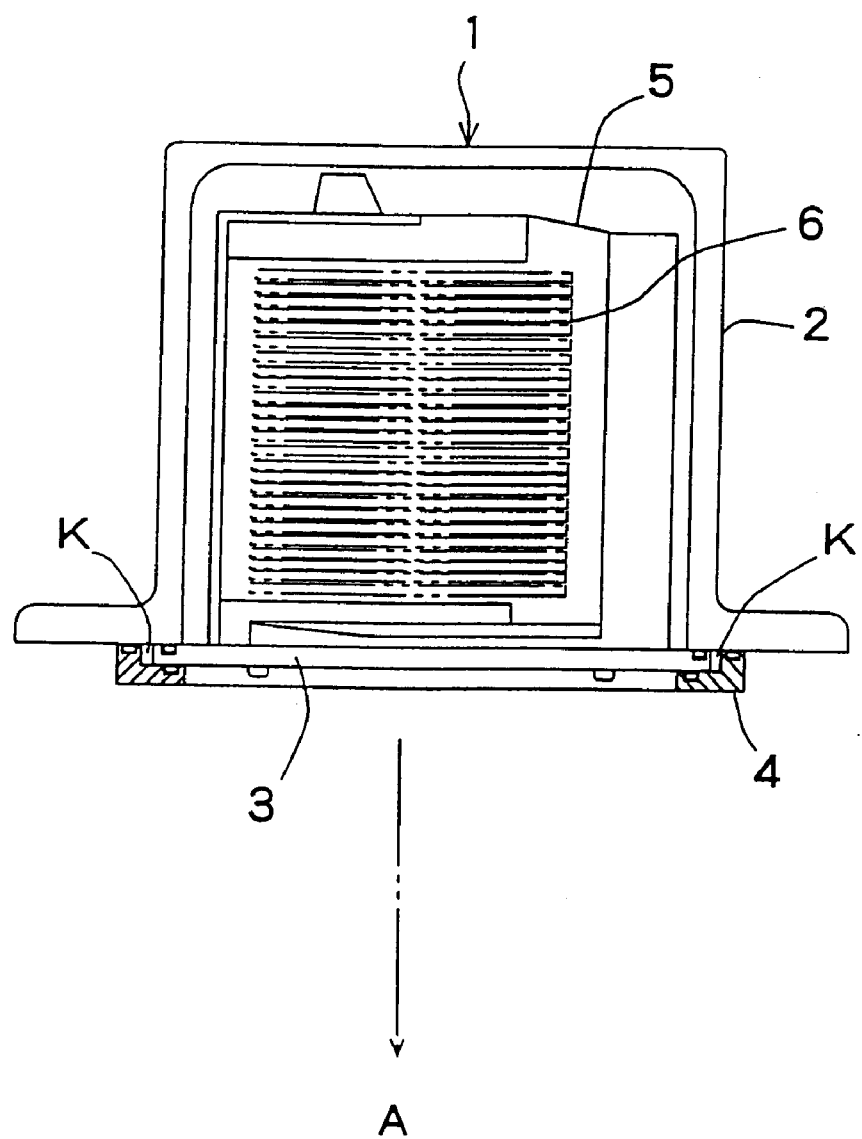
Figure 6:
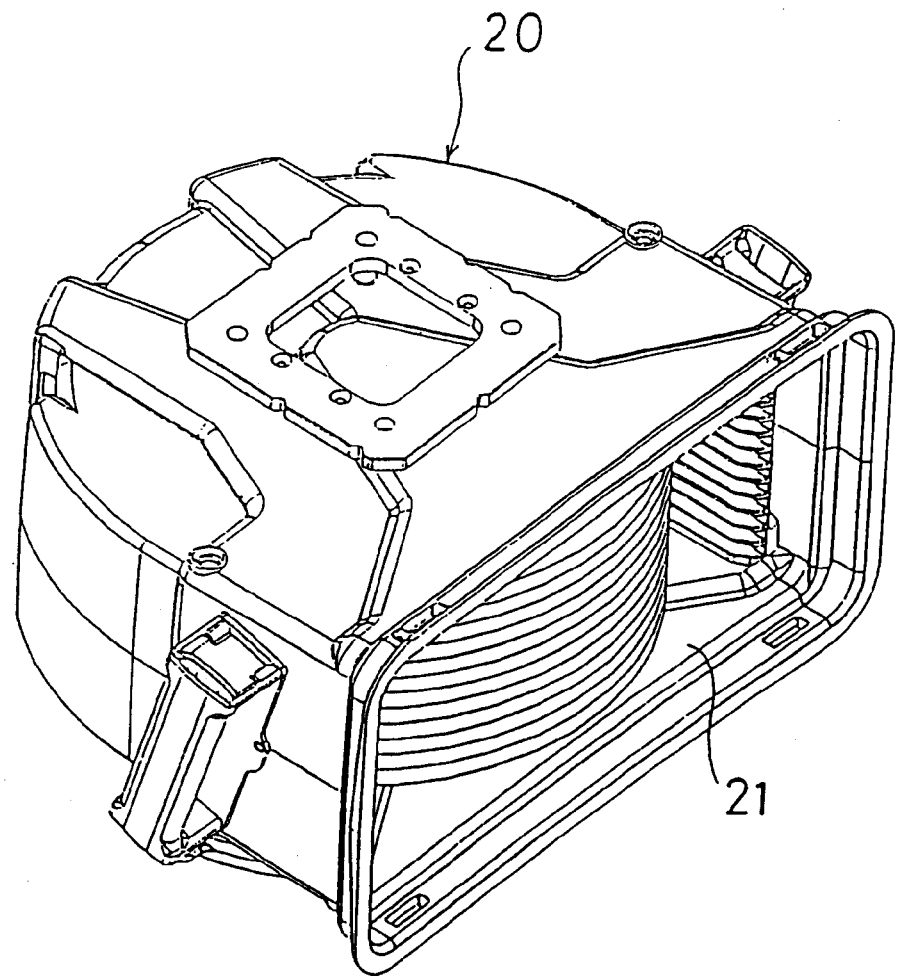
Figure 2:
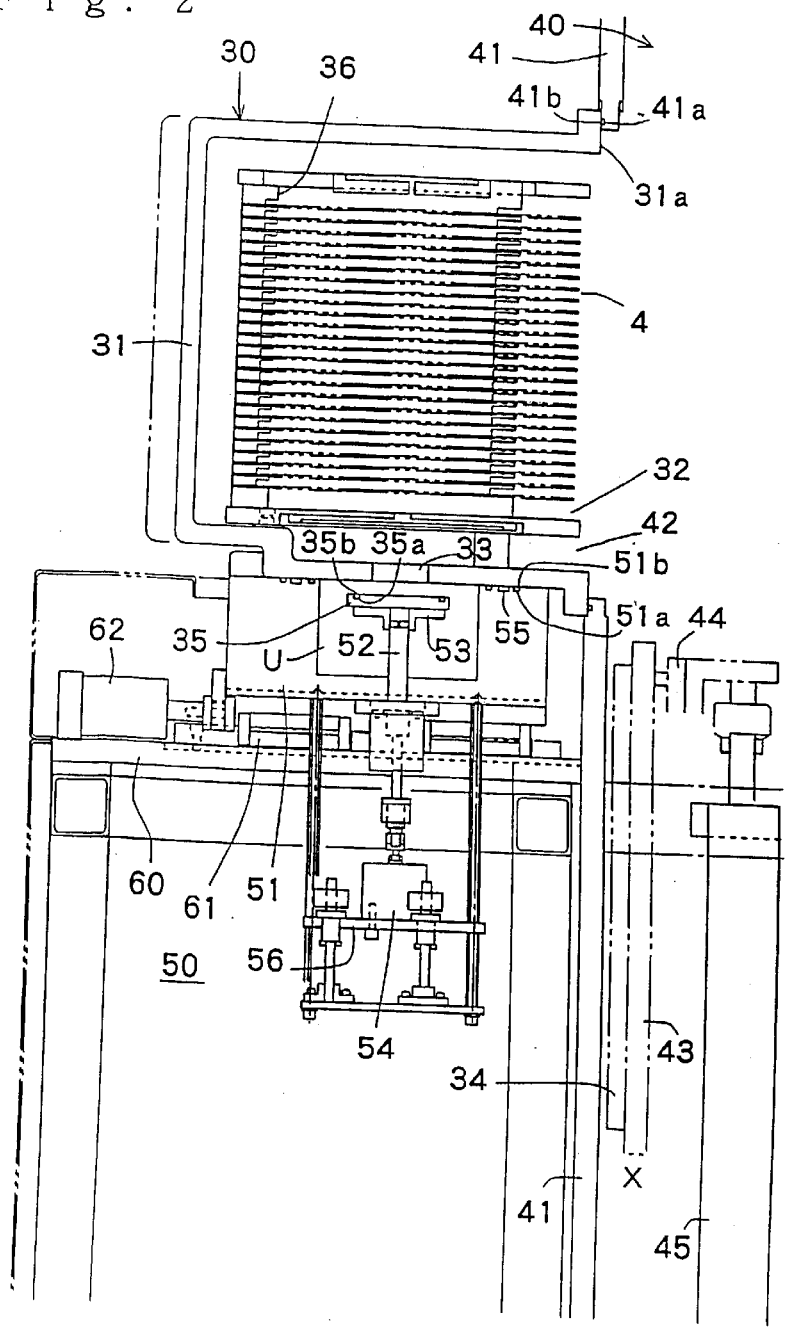
Figure 3:
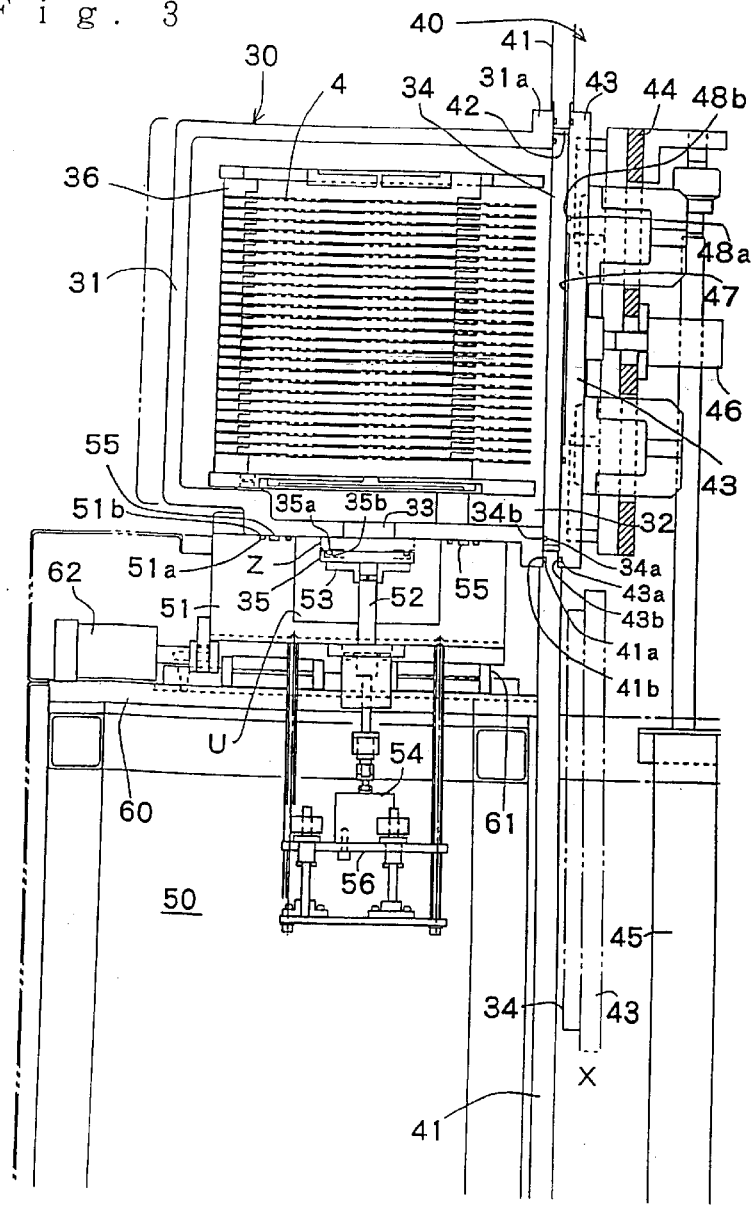
Figure 4:
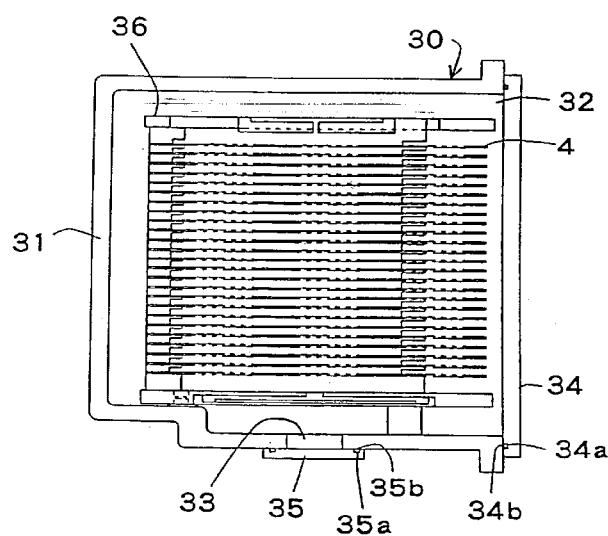
Figure 5:
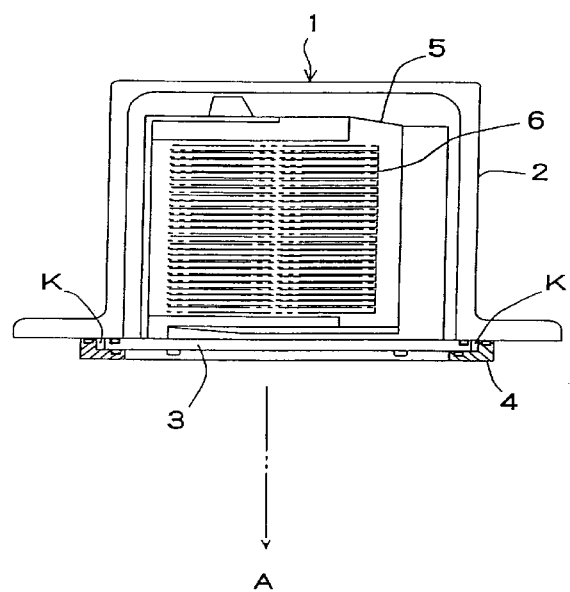
Figure 6:
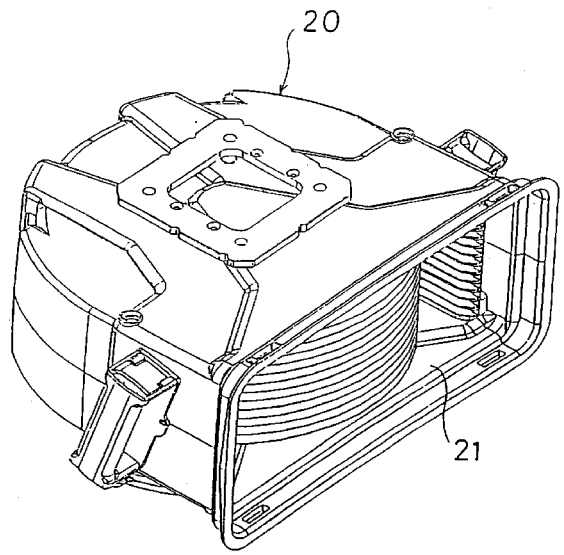

As illustrated in FIG. 4, with the vacuum clean box 30 storing the objects 4 to be transferred, such as the semiconductor wafers or the like, in a state in which the inside of the box is maintained in a vacuum, the side lid 34 and additional lid 35 hermetically close the side aperture 32 and the intake/exhaust small hole 33 by the pressure difference between inside and outside, and in this state the vacuum clean box 30 is free to transfer or store.

When the objects 4 to be transferred are transferred between the vacuum clean box 30 and the clean room 40, the vacuum clean box 30 is mounted on the cup-shape mount stage 51 of the vacuum changer 50, as illustrated in FIG. 1, and the bottom surface of the vacuum clean box 30 (box body 31) is sucked to and held on the cup-shape mount stage 51 by vacuum suction of the annular groove 55 for suction. In this held state of the vacuum clean box 30, the pneumatic cylinder 62 is stretched to move the cup-shape mount stage 51 toward the side wall 41, whereby the side flange portion 31a of the box body 31 becomes hermetically pressed against the outside surface of the side wall 41 in the peripheral part of the gate aperture 42. At this time, as illustrated in FIG. 1, the side lid 34 moves into the gate aperture 42 to go into close fit to the gate valve 43 hermetically closing the gate aperture 42. In addition, vacuum suction of the suction recess 47 on the gate valve 43 side is effected to suck and hold the side lid 34 on the side of the gate valve 43, too.

The inside space U of the cup-shape mount stage 51, the upper surface of which is hermetically closed by the vacuum clean box 30, is evacuated to the vacuum to cancel the pressure difference between inside and outside the additional lid 35 (the inside of the vacuum clean box 30 and the inside space U both becoming vacuum), whereupon the additional lid 35 turns into a state in which it can drop because of its weight. After that, the up-and-down shaft 52 to which the lid receiver 53 is fixed is lowered by the pneumatic cylinder 54 to take the additional lid 35 together with the lid receiver 53 down to the position Y of the fictitious lines of FIG. 1, whereupon the intake/exhaust small hole 33 on the bottom surface side of the box body 31 is opened.

Next, the inside space U of the cup-shape mount stage 51 is made to leak with a clean gas such as clean air, nitrogen, or the like to return the inside space U and the inside of the vacuum clean box 30 in communication therewith to the atmospheric pressure. This cancels the pressure difference between inside and outside of the side lid 34 (the inside of the vacuum clean box 30 and the inside of the clean room 40 both being the atmospheric pressure), whereupon the side lid 34 turns into a state in which it is sucked and held by only the gate valve 43. Then the pneumatic cylinder 46 is retracted to move the gate valve 43 away from the gate aperture 42 and then the pneumatic cylinder 45 is retracted to move the up-and-down member 44 down, whereupon the gate valve 43 is moved down to the position X of FIG. 2 to draw the side lid 34 into the clean room 40, thereby opening the gate aperture 42. In this state of FIG. 2, the inside of the vacuum clean box 30, and the clean room 40 create a continuous space and, therefore, the objects 4 to be transferred, such as the semiconductor wafers or the like, can be taken out of the holder 36 in the vacuum clean box 30 by horizontally transferring them using a carry robot or the like set inside the clean room 40.

Figure 2:
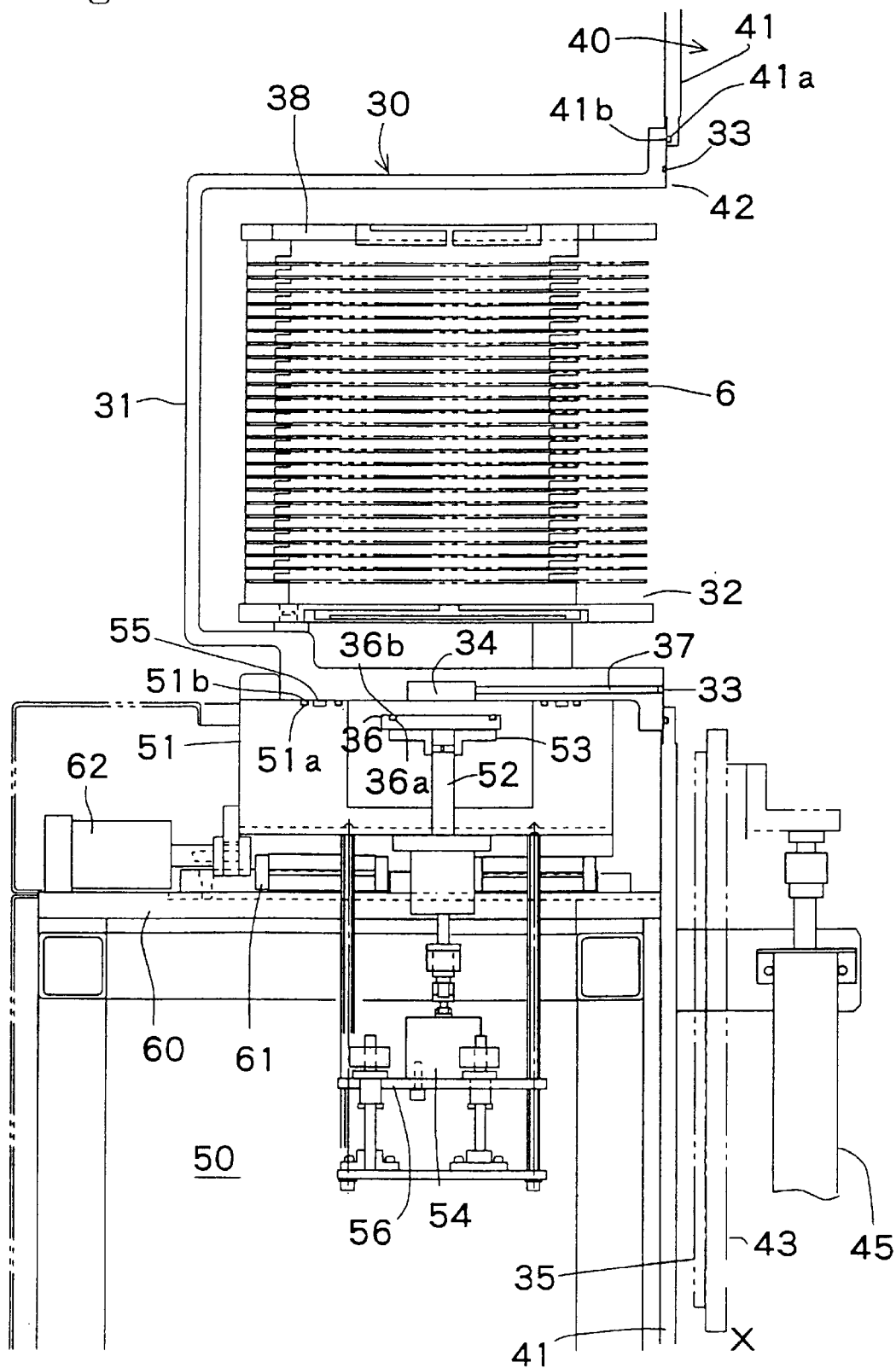
FIG. 2 is a front sectional view of the embodiment to show a state in which the vacuum clean box is connected to the clean room and their inside spaces are in communication with each other.
Figure 3:
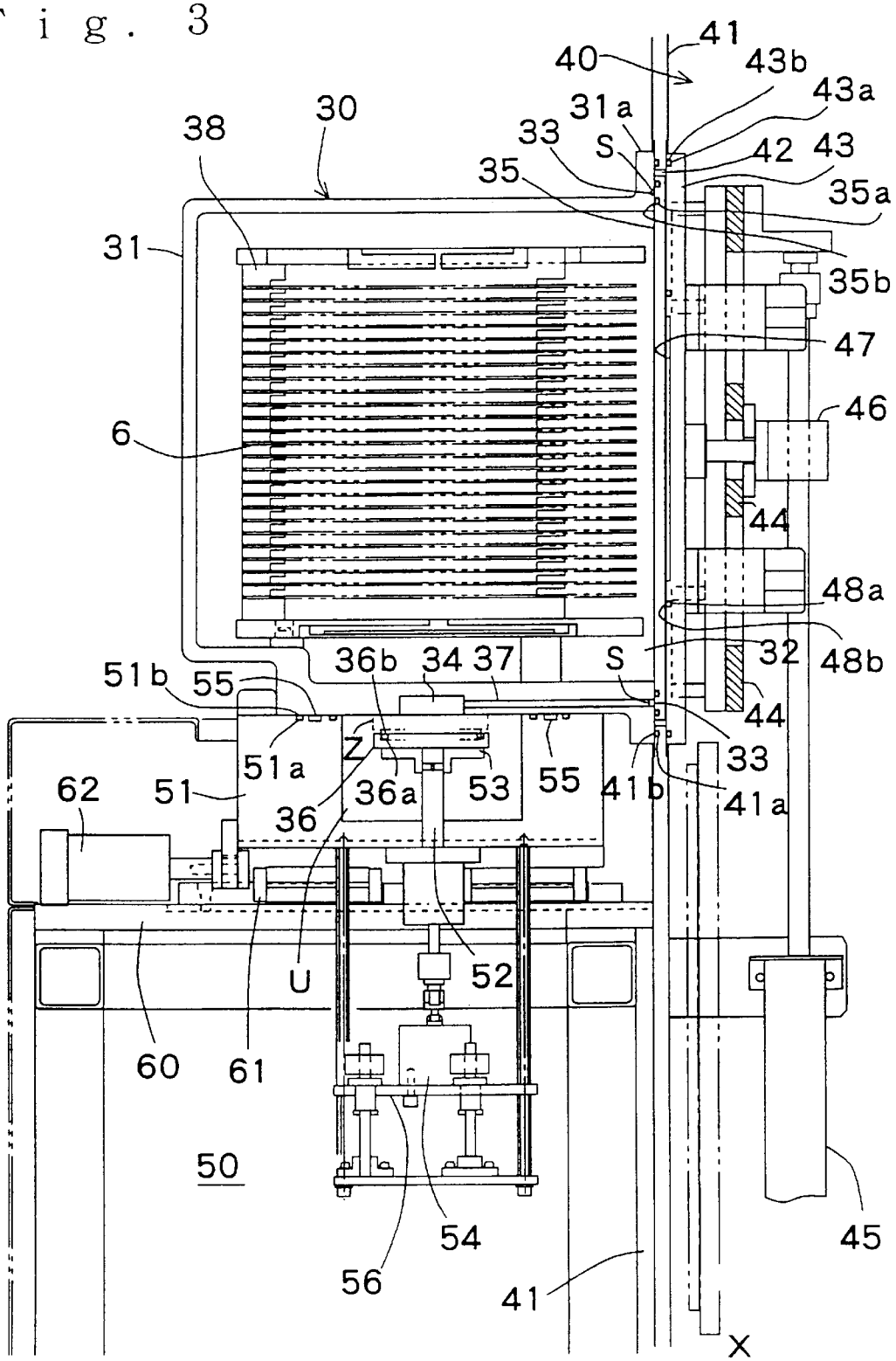
FIG. 3 is a front sectional view of the embodiment to show a separation preparation stage for separation of the vacuum clean box from the clean room, in which the vacuum clean box is mounted on the vacuum changer.

Conversely, the objects 4 to be transferred can also be horizontally transferred in order into the holder 36 in the vacuum clean box 30 in the vacant state of FIG. 2 with the carry robot or the like on the clean room 40 side. After the desired number of objects 6 are stored in the vacuum clean box 30, the cylinder 45 is stretched to move the up-and-down member 44 up to the up position, as illustrated in FIG. 3, and then the cylinder 46 is stretched to press the gate valve 43 against the inside peripheral part of the side wall 41 having the gate aperture 42 to hermetically close the gate aperture 42 and press the side lid 34 under vacuum suction by the gate valve 43 against the side flange portion 31a of the box body 31. In the state in which the side aperture 32 of the vacuum clean box 30 is hermetically closed by the side lid 34, the inside space U of the cup-shape mount stage 51 and the inside of the vacuum clean box 30 are evacuated. After completion of the evacuation, the lid receiver 53 with the additional lid 35 thereon is moved up by the pneumatic cylinder 54 to press the additional lid 35 against the bottom surface of the box body 31, as indicated by fictitious lines Z of FIG. 3, to hermetically close the intake/exhaust small hole 33. After that, the inside space U of the cup-shape mount stage 51 is made to leak with the clean gas such as the clean air, nitrogen, or the like to return the inside space U to the atmospheric pressure. Since this turns the inside of the vacuum clean box 30 into the vacuum and the outside thereof into the atmospheric pressure, the side lid 34 and additional lid 35 hermetically seal the side aperture 32 and the intake/exhaust small hole 33 with certainty by the pressure difference between inside and outside even without the mechanical seal mechanism. When the suction of the side lid 34 by the gate valve 43 is released thereafter, the vacuum clean box becomes free to transfer, as illustrated in FIG. 4, and thus the vacuum clean box 30 can be transferred to an arbitrary position by an automatic guided vehicle or the like.

The embodiment described above has the following effects.

(1) Since the vacuum clean box 30 is constructed such that the side aperture 32 for taking-out of the objects to be transferred is hermetically closed by the side lid 34 while the intake/exhaust small hole 33 by the additional lid 35 by the pressure difference between inside and outside, the embodiment can realize the side open type structure without use of the mechanical seal employed in the conventional products and overcome the drawbacks in use of the mechanical seal.

(2) Since the vacuum clean box 30 is of the side open type, the objects 4 to be transferred can be moved horizontally and transferred in the connected state of the vacuum clean box 30 to the clean room 40. This obviates the need for the excess motion for the interface with various processing devices. Since the vacuum clean box 30 uses no mechanical seal, connection or disconnection thereof is also easy to or from the gate aperture 42 of the clean room 40.

(3) Since the vacuum clean box 30 is of the side open type, it does not require the vertical motion, which was required in the conventional structure in which the objects to be transferred were taken out from the bottom surface of the vacuum clean box, the placement position of the vacuum clean box 30 with respect to the vacuum changer 50 does not have to be set high, and the vacuum clean box 30 can be preliminarily set at the height suitable for the operation in the clean room 40.

The above embodiment illustrated the example in which the intake/exhaust small hole 33 used for intake/exhaust to or from the inside of the vacuum clean box 30 was provided in the bottom surface of the box body 31, but it can also be contemplated that the intake/exhaust small hole 33 is formed in one surface except for the surface in which the side aperture 32 is provided, without having to be limited to the bottom surface, and it is hermetically sealed by the additional lid 35.

The embodiments of the present invention have been described above and it is apparent to those who skilled in the art that the present invention is not limited to the embodiments but can embrace various modifications and changes included within the spirit and scope of the appended claims.

As described above, the present invention can realize the vacuum clean box of the side open type in the simple structure without use of the mechanical seal employed in the conventional products, and can overcome the drawbacks in use of the mechanical seal. Since the present invention employs no mechanical seal, connection or disconnection of the vacuum clean box is also easy to or from the gate aperture of the vacuum clean room.

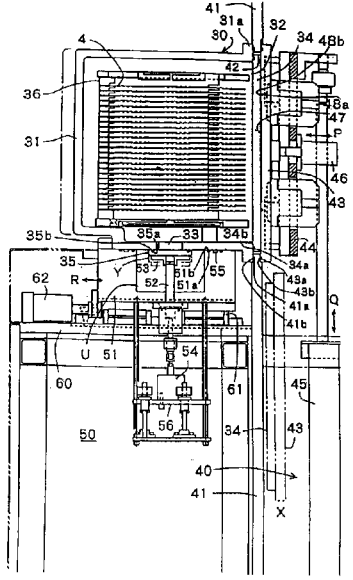

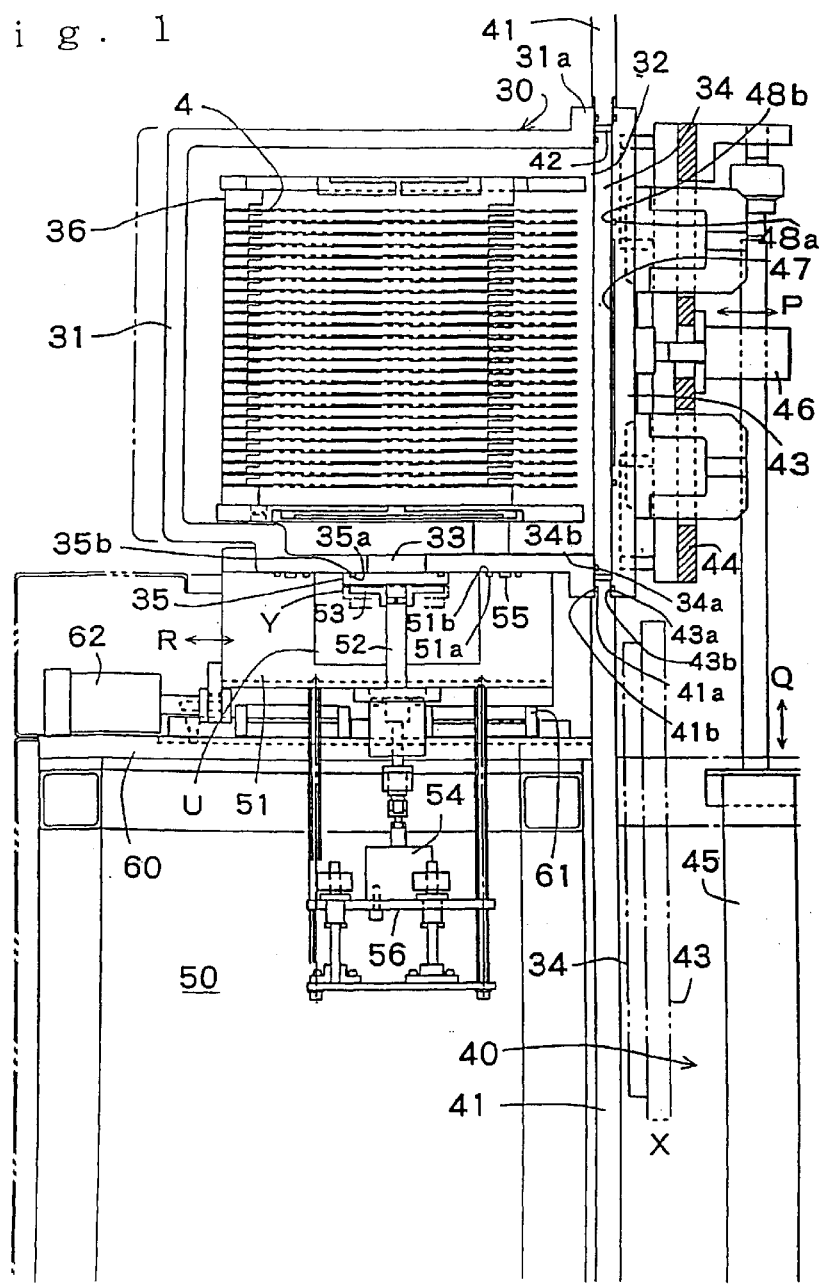

What is claimed is:

1. A vacuum clean box comprising:
   a box body having an aperture in one side surface and a small hole for intake/exhaust in another surface;
   a side lid for hermetically closing said aperture by a pressure difference between inside and outside thereof; and
   an additional lid for hermetically closing said small hole for intake/exhaust by a pressure difference between inside and outside thereof, the additional lid being adapted to be released by making the pressure outside the clean box around the additional lid equal to or lower than the pressure of the inside of the clean box.

2. A clean transfer method using a vacuum clean box comprising a box body having an aperture in one side surface and a small hole for intake/exhaust in another surface; a side lid for hermetically closing said aperture by a pressure difference between inside and outside thereof; and an additional lid for hermetically closing said small hole for intake/exhaust by a pressure difference between inside and outside thereof, said clean transfer method comprising the steps of:
   hermetically connecting said vacuum clean box to a gate aperture of a clean device, said gate aperture being formed in a side wall surface of said clean device and being hermetically closed by a gate valve;
   evacuating a hermetically closed limited space outside the box body around said additional lid, by a vacuum changer to cancel the pressure difference between inside and outside of said additional lid and opening said small hole for intake/exhaust to turn the inside of said vacuum clean box into the atmospheric pressure through said small hole for intake/exhaust;
   thereafter drawing the side lid into said clean device while holding said side lid by said gate valve to establish communication between an inside space of said vacuum clean box and the inside of said clean device; and
   transferring objects to be transferred between said clean box and said clean device.

3. A clean transfer apparatus comprising:
   a vacuum clean box comprising a box body having an aperture in one side surface and a small hole for intake/exhaust in another surface; a side lid for hermetically closing said aperture by a pressure difference between inside and outside thereof; and an additional lid for hermetically closing said small hole for intake/exhaust by a pressure difference between inside and outside thereof;
   a clean device having a gate aperture formed in a side wall surface thereof and a gate valve capable of opening or closing said gate aperture and capable of holding the side lid of the vacuum clean box connected to the gate aperture; and
   a vacuum changer for evacuating a hermetically closed limited space outside the box body around the additional lid of the vacuum clean box connected to said gate aperture,
   wherein in a state in which said vacuum changer cancels the pressure difference between inside and outside of said additional lid and opens said small hole for intake/exhaust to turn the inside of said vacuum clean box into the atmospheric pressure through said small hole for intake/exhaust, said side lid is drawn into said clean device while being held by said gate valve, to establish conmnunication between an inside space of said vacuum clean box and the inside of said vacuum clean device.

4. The clean transfer apparatus according to claim 3, wherein:
   said vacuum changer has a box holding member in which a vacuum suction passage for suction of said box body is formed in an opposite surface thereof to said box body; and
   said hermetically closed space is formed inside said box holding member.

5. The clean transfer apparatus according to claim 4, wherein said vacuum changer has a lid receiver positioned and configured to receive said additional lid separated from said box body, inside said box holding member, said lid receiver being movable.

* * * * *

UNITED STATES PATENT AND TRADEMARK OFFICE
CERTIFICATE OF CORRECTION

PATENT NO.    : 6,168,364 B1
DATED         : January 2, 2001
INVENTOR(S)   : Toshihiko Miyajima It is certified that error appears in the above-identified patent and that said Letters Patent is hereby corrected as shown below:

The title pages showing an illustrated figure, should be deleted and substituted therefor the attached title page.

Delete drawing sheets 1-6, and substitute therefor the attached drawing sheets 1-6.

Signed and Sealed this

Sixteenth Day of September, 2003

JAMES E. ROGAN
*Director of the United States Patent and Trademark Office*

(12) United States Patent
Miyajima

(10) Patent No.: US 6,168,364 B1
(45) Date of Patent: Jan. 2, 2001

(54) VACUUM CLEAN BOX, CLEAN TRANSFER METHOD AND APPARATUS THEREFOR

(75) Inventor: Toshihiko Miyajima, Tokyo (JP)

(73) Assignee: TDK Corporation, Tokyo (JP)

(*) Notice: Under 35 U.S.C. 154(b), the term of this patent shall be extended for 0 days.

(21) Appl. No.: 09/294,005

(22) Filed: Apr. 19, 1999

(51) Int. Cl.[7] .................................................. B65G 49/07
(52) U.S. Cl. .................................................. 414/217; 414/940
(58) Field of Search ................................... 414/939, 940, 414/217, 217.1

(56) References Cited

U.S. PATENT DOCUMENTS

| | | | |
|---|---|---|---|
| 4,636,128 | * 1/1987 | Millis et al. | 414/217 |
| 5,139,459 | 8/1992 | Takahashi et al. | |
| 5,364,219 | 11/1994 | Takahashi et al. | |
| 5,472,086 | * 12/1995 | Holliday et al. | 414/217 X |
| 5,562,383 | * 10/1996 | Iwai et al. | 414/940 X |
| 5,609,459 | * 3/1997 | Muka | 414/217.1 |
| 5,730,573 | 3/1998 | Masujima et al. | |

FOREIGN PATENT DOCUMENTS

| | | | |
|---|---|---|---|
| 63-28047 | 2/1988 | (JP) | |
| 63-190338 | * 8/1988 | (JP) | 414/940 |
| 2525284 | 5/1996 | (JP) | |
| 9-246351 | 9/1997 | (JP) | |
| 2722306 | 11/1997 | (JP) | |
| 10-56050 | 2/1998 | (JP) | |
| 2757102 | 3/1998 | (JP) | |
| 10-321695 | 12/1998 | (JP) | |
| 10-32196 | 12/1998 | (JP) | |

* cited by examiner

Primary Examiner—Steven A. Bratlie
(74) Attorney, Agent, or Firm—Oblon, Spivak, McClelland, Maier & Neustadt, P.C.

(57) ABSTRACT

A vacuum clean box 30 includes a box body 31 having a side aperture 32 and a small hole 33 for intake/exhaust, a side lid 34 for closing the side aperture 32 by a pressure difference between inside and outside thereof, and an additional lid 35 for similarly closing the small hole 33 for intake/exhaust. The vacuum clean box 30 is connected to a gate aperture 42 of a clean room 40 and a vacuum changer 50 evacuates a hermetically closed space outside the box body including the additional lid 35 to cancel the pressure difference between inside and outside of the additional lid 35 and then opens the small hole 33 for intake/exhaust. After the inside of the vacuum clean box 30 is turned into the atmospheric pressure through the small hole 33 for intake/exhaust, the side lid 34 is drawn into the clean room 40 to make communication between the inside space of the vacuum clean box and the inside of the clean room 40, and then objects to be transferred are transferred between the vacuum clean box and the clean room.

5 Claims, 6 Drawing Sheets

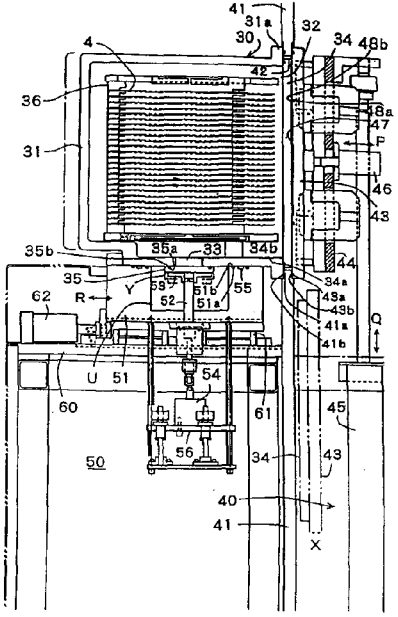

UNITED STATES PATENT AND TRADEMARK OFFICE
CERTIFICATE OF CORRECTION

PATENT NO.     : 6,168,364 B1
DATED          : January 2, 2001
INVENTOR(S)    : Toshihiko Miyajima It is certified that error appears in the above-identified patent and that said Letters Patent is hereby corrected as shown below:

The title page showing an illustrated figure, should be deleted and substituted therefor the attached title page.

Delete drawing sheets 1-6, and substitute therefor the attached drawing sheets 1-6.

Signed and Sealed this

Thirtieth Day of September, 2003

JAMES E. ROGAN
*Director of the United States Patent and Trademark Office*

(12) United States Patent  (10) Patent No.: US 6,168,364 B1
Miyajima  (45) Date of Patent: Jan. 2, 2001

(54) VACUUM CLEAN BOX, CLEAN TRANSFER METHOD AND APPARATUS THEREFOR

(75) Inventor: Toshihiko Miyajima, Tokyo (JP)

(73) Assignee: TDK Corporation, Tokyo (JP)

(*) Notice: Under 35 U.S.C. 154(b), the term of this patent shall be extended for 0 days.

(21) Appl. No.: 09/294,005

(22) Filed: Apr. 19, 1999

(51) Int. Cl.[7] .................................................. B65G 49/07
(52) U.S. Cl. ............................................ 414/217; 414/940
(58) Field of Search .................................... 414/939, 940, 414/217, 217.1

(56) References Cited

U.S. PATENT DOCUMENTS

| | | | |
|---|---|---|---|
| 4,636,128 | * 1/1987 | Millis et al. | 414/217 |
| 5,139,459 | 8/1992 | Takahashi et al. . | |
| 5,364,219 | 11/1994 | Takahashi et al. . | |
| 5,472,086 | * 12/1995 | Holliday et al. | 414/217 X |
| 5,562,383 | * 10/1996 | Iwai et al. | 414/940 X |
| 5,609,459 | * 3/1997 | Muka | 414/217.1 |
| 5,730,573 | 3/1998 | Masujima et al. . | |

FOREIGN PATENT DOCUMENTS

| | | | |
|---|---|---|---|
| 63-28047 | 2/1988 | (JP) . | |
| 63-190338 | * 8/1988 | (JP) | 414/940 |
| 2525284 | 5/1996 | (JP) . | |
| 9-246351 | 9/1997 | (JP) . | |
| 2722306 | 11/1997 | (JP) . | |
| 10-56050 | 2/1998 | (JP) . | |
| 2757102 | 3/1998 | (JP) . | |
| 10-321695 | 12/1998 | (JP) . | |
| 10-32196 | 12/1998 | (JP) . | |

* cited by examiner

Primary Examiner—Steven A. Bratlie
(74) Attorney, Agent, or Firm—Oblon, Spivak, McClelland, Maier & Neustadt, P.C.

(57) ABSTRACT

A vacuum clean box 30 includes a box body 31 having a side aperture 32 and a small hole 33 for intake/exhaust, a side lid 34 for closing the side aperture 32 by a pressure difference between inside and outside thereof, and an additional lid 35 for similarly closing the small hole 33 for intake/exhaust. The vacuum clean box 30 is connected to a gate aperture 42 of a clean room 40 and a vacuum changer 50 evacuates a hermetically closed space outside the box body including the additional lid 35 to cancel the pressure difference between inside and outside of the additional lid 35 and then opens the small hole 33 for intake/exhaust. After the inside of the vacuum clean box 30 is turned into the atmospheric pressure through the small hole 33 for intake/exhaust, the side lid 34 is drawn into the clean room 40 to make communication between the inside space of the vacuum clean box and the inside of the clean room 40, and then objects to be transferred are transferred between the vacuum clean box and the clean room.

5 Claims, 6 Drawing Sheets